United States Patent Office 3,575,925

Patented Apr. 20, 1971

3,575,925

PHOTOSENSITIVE COATING SYSTEMS

Martin Skoultchi, Somerset, N.J., assignor to National Starch and Chemical Corporation, New York, N.Y.

No Drawing. Filed June 17, 1968, Ser. No. 737,281

Int. Cl. C08f *15/18, 37/06*

U.S. Cl. 260—47 7 Claims

ABSTRACT OF THE DISCLOSURE

Ethylenically unsaturated derivatives of substituted benzoic acids, phenols and naphthoic acids which are prepared by means of a method involving reacting the substituted acid or phenol with an ethylenically unsaturated reagent such as glycidyl acrylate and glycidyl methacrylate. The resulting monomers may, thereafter, be homo- or copolymerized with a wide variety of conventional ethylenically unsaturated, i.e. vinyl, monomers. As a result of the presence of such monomers, the resulting homo- and copolymers are senitive to external stimuli such as ultra-violet and visible light and will readily crosslink upon exposure to such stimuli. Organic solvent solutions or aqueous emulsions of these copolymers may be deposited upon solid substrates thereby providing photosensitive coating systems which are suitable for use in the lithographic and chemical milling fields.

BACKGROUND OF THE INVENTION

As is well known to those skilled in the art, there are a variety of photosensitive polymers capable of being insolubilized, by means of a crosslinking reaction, upon their exposure to actinic radiation and which are, accordingly, employed in the preparation of products which take direct advantage of this unique property. Thus, such photosensitive polymers are used in preparing coating systems employed in the printing industry. For example, upon being coated upon a suitable substrate, the resulting photosensitive plate can be exposed to a light source through an image bearing transparency consisting of opaque and transparent areas. Thereafter the unexposed areas of the plate are removed by washing with water or a suitable solvent so as to leave behind a positive image consisting of the exposed areas of the plate which are now in the form of an insolubilized, i.e. crosslinked, polymer. Such plates may then be used to reproduce the image of the original transparency in any number of applicable printing processes.

Also of great interest is the use of these photosensitive polymers in so called chemical milling or photoresist operations wherein the polymer is coated upon both surfaces of a metal plate and the resulting coatings are each thereafter exposed, through a negative, to a suitable light source. After washing off the uncrosslinked polymer with a suitable solvent, those areas of the metal plate which are not protected by the exposed, crosslinked polymer coating are etched away with an appropriate etchant. The latter technique is rapidly gaining widespread acceptance in many areas requiring the precision working of thin sections of metals.

There are, however, certain drawbacks and disadvantages inherent in many of the presently available photosensitive coating systems which have tended to curtail their utilization in industrial applications. Thus, for example, some photosensitive polymers are extremely unstable and cannot be applied to substrates which are to be used at a later date. Such photosensitive polymers must, therefore, be coated upon substartes by the ultimate user immediately prior to the time at which they are to be used. Needless to say, the latter requirement is a great inconvenience inasmuch as it often leads to poor results on the part of an individual who lacks the necessary skills and equipment for the adequate preparation of these products.

In addition, many presently available photosensitive coating systems are characterized by their relative insensitivity, i.e. their need for lengthy exposure periods, which precludes their use in many automated processes wherein a rapid exposure period is mandated. And, still another poor feature of certain of these photsensitive polymers is their requirement for thermal curing so as to be able to develop satisfactory resistance to certain etching solutions which are used in chemical milling operations. Furthermore, where extraneous photo-crosslinking agents were of necessity blended with the polymers utilized in the photosensitive coatings, problems of compatibility, uniform dispersion, volatility, toxicity, exudation and migration of the additive have been encountered thereby often resulting in premature and non-uniform crosslinking.

SUMMARY OF THE INVENTION

It is, thus, the object of this invention to provide a novel class of ethylenically unsaturated derivatives of substituted benzoic acids, naphthoic acids, and phenols, said derivatives being capable of undergoing vinyl type polymerization reactions either alone or in the presence of other vinyl type monomers. A further object of this invention is to provide polymeric compositions containing the latter ethylenically unsaturated derivatives, the presence of such derivatives in said polymeric compositions rendering them sensitive to ultraviolet and visible light and thus capable of crosslinking upon exposure to the latter light sources.

Still another object of this invention is to provide novel photosensitive coating systems for use in various printing and chemical milling applications, said coating systems being characterized by their outstanding stability, their sensitivity and their ability to be used in the absence of a thermal curing step.

Various other objects and advantages of this invention will become apparent to the practitioner from a reading of the following description.

The novel monomeric compositions of this invention are the ethylenically unsaturated derivatives of substituted benzoic acids, phenols and naphthoic acids corresponding to the formulae:

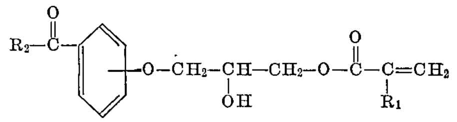

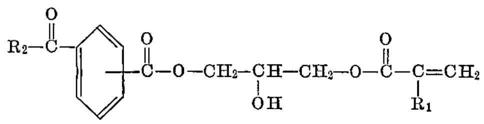

and

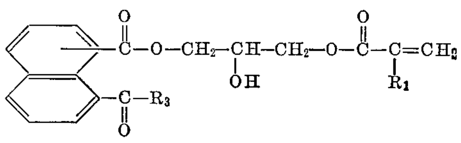

wherein:

$R_1$ is selected from the group consisting of hydrogen atoms and methyl radicals;

$R_2$ is a radical selected from the group consisting of naphthyl, anthracenyl, and phenanthracenyl radicals; and, $R_3$ is a radical selected from the group consisting of phenyl, naphthyl, anthracenyl and phenanthracenyl radicals.

As representative of the above described compositions of this invention, one may list the following compounds all of which may be characterized as either ethers or esters of substituted benzoic acids, phenols and naphthoic acids.

1-(2-hydroxy-3-acryloxy)propyl-2-(beta-naphthoyl) benzoate;
1-(2-hydroxy-3-acryloxy)propyl-3-(beta-naphthoyl) benzoate;
1-(2-hydroxy-3-acryloxy)propyl-4-(beta-naphthoyl) benzoate;
1-(2-hydroxy-3-acryloxy)propoxy-2-(beta-naphthoyl) benzene;
1-(2-hydroxy-3-acryloxy)propoxy-3-(beta-naphthoyl) benzene;
1-(2-hydroxy-3-acryloxy)propoxy-4-(beta-naphthoyl) benzene;
1-(2-hydroxy-3-acryloxy)propyl-2-(alpha-naphthoyl) benzoate;
1-(2-hydroxy-3-acryloxy)propyl-3-(alpha-naphthoyl) benzoate;
1-(2-hydroxy-3-acryloxy)propyl-4-(alpha-naphthoyl) benzoate;
1-(2-hydroxy-3-acryloxy)propoxy-2-(alpha-naphthoyl) benzene;
1-(2-hydroxy-3-acryloxy)propoxy-3-(alpha-naphthoyl) benzene;
1-(2-hydroxy-3-acryloxy)propoxy-4-(alpha-naphthoyl) benzene;
1-(2-hydroxy-3-acryloxy)propyl-2-(9-anthroyl)benzoate;
1-(2-hydroxy-3-acryloxy)propyl-3-(9-anthroyl)benzoate;
1-(2-hydroxy-3-acryloxy)propyl-4-(9-anthroyl)benzoate;
1-(2-hydroxy-3-acryloxy)propoxy-2-(9-anthroyl) benzene;
1-(2-hydroxy-3-acryloxy)propoxy-3-(9-anthroyl) benzene;
1-(2-hydroxy-3-acryloxy)propoxy-4-(9-anthroyl) benzene;
1-(2-hydroxy-3-acryloxy)propyl-2-(3-phenanthroyl) benzoate;
1-(2-hydroxy-3-acryloxy)propyl-3-(3-phenanthroyl) benzoate;
1-(2-hydroxy-3-acryloxy)propyl-4-(3-phenanthroyl) benzoate;
1-(2-hydroxy-3-acryloxy)propoxy-2-(3-phenanthroyl) benzene;
1-(2-hydroxy-3-acryloxy)propoxy-3-(3-phenanthroyl) benzene;
1-(2-hydroxy-3-acryloxy)propoxy-4-(3-phenanthroyl) benzene;
1-(2-hydroxy-3-acryloxy)propyl-2-(2-phenanthroyl) benzoate;
1-(2-hydroxy-3-acryloxy)propyl-3-(2-phenanthroyl) benzoate;
1-(2-hydroxy-3-acryloxy)propyl-4-(2-phenanthroyl) benzoate;
1-(2-hydroxy-3-acryloxy)propoxy-2-(2-phenanthroyl) benzene;
1-(2-hydroxy-3-acryloxy)propoxy-3-(2-phenanthroyl) benzene;
1-(2-hydroxy-3-acryloxy)propoxy-4-(2-phenanthroyl) benzene;
1-(2-hydroxy-3-acryloxy)propyl-2-(9-phenanthroyl) benzoate;
1-(2-hydroxy-3-acryloxy)propyl-3-(9-phenanthroyl) benzoate;
1-(2-hydroxy-3-acryloxy)propyl-4-(9-phenanthroyl) benzoate;
1-(2-hydroxy-3-acryloxy)propoxy-2-(9-phenanthroyl) benzene;
1-(2-hydroxy-3-acryloxy)propoxy-3-(9-phenanthroyl) benzene;
1-(2-hydroxy-3-acryloxy)propoxy-4-(9-phenanthroyl) benzene;
1-(2-hydroxy-3-acryloxy)propyl-8-benzoyl naphthoate;
1-(2-hydroxy-3-acryloxy)propyl-8-(alpha-naphthoyl) naphthoate;
1-(2-hydroxy-3-acryloxy)propyl-8-(9-anthroyl) naphthoate;
1-(2-hydroxy-3-acryloxy)propyl-8-(3-phenanthroyl) naphthoate;
1-(2-hydroxy-3-acryloxy)propyl-8-(2-phenanthroyl) naphthoate;
1-(2-hydroxy-3-acryloxy)propyl-8-(9-phenanthroyl) naphthoate;

and, the corresponding 1-(2-hydroxy-3-methacryloxy) derivatives of each of the compositions.

All of the above listed compounds, as well as any others which may correspond to the above definition, are materials which are capable of readily undergoing vinyl type polymerization reactions with a wide variety of other vinyl type monomers, the resulting copolymers exhibiting sensitivity to ultra-violet and visible light and thus readily crosslinking upon exposure to such stimuli. This beneficial property is exhibited by these copolymers as a result of the presence therein of the substituted benzoyl or naphthoyl moiety which is permanently bound into and inherently part of the resulting copolymer molecule. In addition to obviating the difficulties inherent in the use of extraneous additives, such as migration and nonuniformity, the permanent bonding of the benzoyl or naphthoyl group in the polymeric back-bone increases the crosslinking efficiency of such copolymers to a degree which was not previously attainable by the use of post-added photosensitizers. Such permanent bonding also provides a crosslinking potential for copolymers wherein such crosslinking was not previously possible.

DETAILED DESCRIPTION OF THE INVENTION

In brief, the synthesis of my novel derivatives is accomplished by the catalyzed reaction of a selected substituted intermediate, as hereinafter defined, with an ethylenically unsaturated reagent selected from the group consisting of glycidyl acrylate and glycidyl methacrylate.

The substituted benzoic acids, phenols and naphthoic acids which are applicable for use as intermediates in preparing the novel ethylenically unsaturated derivatives of this invention correspond to the formulae:

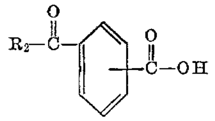

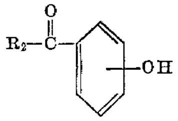

and

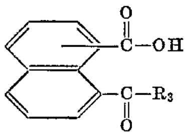

wherein $R_2$ and $R_3$ are as defined hereinabove.

As representative of the above described intermediates, one may list the following compounds:

ortho, meta and para (beta-naphthoyl)benzoic acids, i.e.

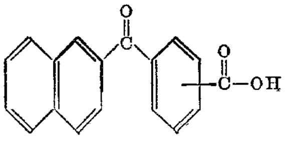

ortho-, meta-, and para (beta-naphthoyl)phenols, i.e.

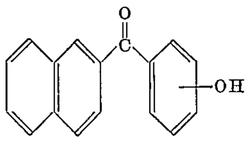

ortho-, meta-, and para (alpha-naphthoyl)benzoic acids, i.e.

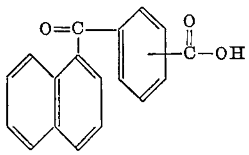

ortho-, meta-, and para (alpha-naphthoyl)phenols, i.e.

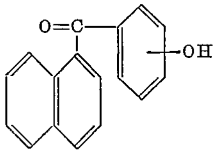

ortho-, meta-, and para (9-anthroyl)benzoic acids, i.e.

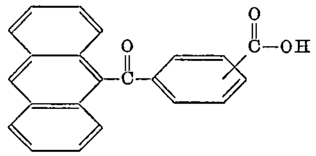

ortho-, meta-, and para (9-anthroyl)phenols, i.e.

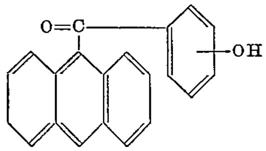

ortho-, meta-, and para (3-phenanthroyl)benzoic acids, i.e.

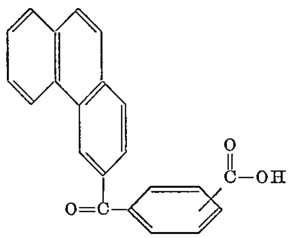

ortho-, meta-, and para (3-phenanthroyl)phenols, i.e.

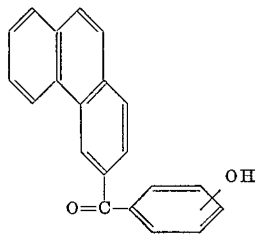

ortho-, meta-, and para (2-phenanthroyl)benzoic acids, i.e.

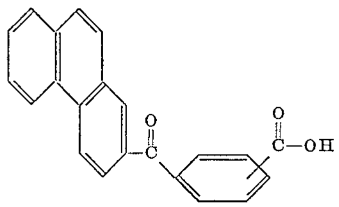

ortho-, meta-, and para (2-phenanthroyl)phenols, i.e.

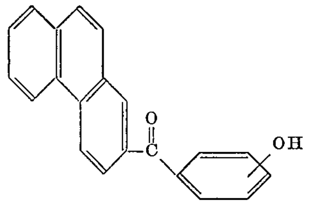

ortho-, meta-, and para (9-phenanthroyl)benzoic acids, i.e.

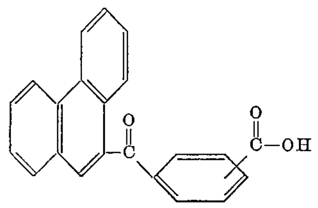

ortho-, meta-, and para (9-phenanthroyl)phenols, i.e.

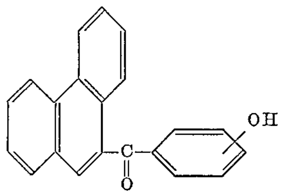

8-benzoyl-1-naphthoic acid, i.e.

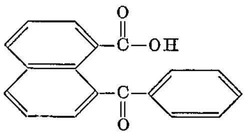

8-(alpha-napthoyl)-1-naphthoic acid, i.e.

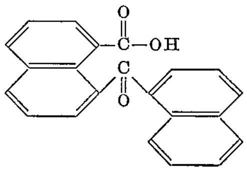

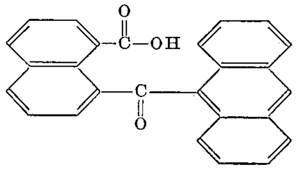

and, 8-(3-phenanthroyl)-1-naphthoic acid, i.e.

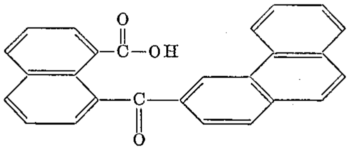

In conducting the reaction which leads to the synthesis of my novel derivatives, the selected ethylenically unsaturated reagent, i.e. either glycidyl acrylate or glycidyl methacrylate, in an equimolar concentration or a concentration amounting to a slight stoichiometric excess in the order of about 10 to 20% over the subsequently added intermediate, is first ordinarily admixed with the selected catalyst. The latter may be chosen from among any member of the group consisting of alkali metal hydroxides, such as sodium hydroxide or potassium hydroxide; the salts of alkali metals, such as sodium bicarbonate or sodium chloride; the alkali metal acetates, such as sodium acetate or lithium acetate; and, the quaternary ammonium halides, such as tetramethylammonium chloride or tetrabutylammonium iodide. These catalysts should be present in concentrations of about 0.1 to 10.0% based on the weight of the ethylenically unsaturated reagent.

Following the initial preparation of the mixture comprising the catalyst and the ethylenically unsaturated reagent, the intermediate composition is thereupon added with constant agitation. However, it should be emphasized that the use of this particular sequence is not critical to the process of this invention and may be altered by the practitioner to suit his particular needs. It is, in fact, possible to admix the reactants and the catalyst in any desired sequence. In any event, following the complete admixture of the intermediate with the catalyst and the ethylenically unsaturated reagent, agitation is continued while the resulting reaction mixture is maintained at a temperature in the range of about 50 to 100° C., and preferably at about 70 to 90° C., for a period of about 2 to 14 hours. Under these conditions, the reaction between the intermediate and the ethylenically unsaturated reagent will ordinarily proceed to a conversion in the range of about 80 to 95%.

In general, the preparation of the derivatives of this invention may be conducted at any temperature which will be high enough to result in an adequate reaction rate. In addition, the length of the reaction period will depend, for the most part, upon the specific ethylenically unsaturated reagent which is being utilized. Thus, it is a matter of ordinary preparative experience on the part of the practitioner to determine the precise combination of time and temperature which will be best suited for his synthesis of any of the novel derivatives coming within the scope of this invention, since the examples herein are merely illustrative.

Upon the completion of the reaction and with subsequent cooling of the reaction vessel to room temperature, the resulting products will ordinarily be in the form of viscous oils. For most purposes, including any subsequent polymerization reaction, this crude ethylenically unsaturated derivative can then be used without any further purification being necessary. However, where desired, the relatively small amount of unreacted intermediate may be removed. Thus, such means as chromatographic separation techniques, as for example with the use of a silica gel column, have been found to yield a product which, by means of saponification equivalent analysis, will indicate a purity of almost 100%, by weight. Other separation techniques, such as aqueous alkali or organic solvent extraction procedures, may also be used where so desired by the practioner.

It is also possible to prepare the novel derivatives of this invention by reaction in an organic solvent medium. Under these conditions, the intermediate, the catalyst and the ethylenically unsaturated reagent may all be dissolved in a non-reactive polar solvent such as acetone, methyl ethyl ketone, tetrahydrofuran, dimethylformamide or dimethylsulfoxide. The resulting derivative would then be recovered by distilling off the solvent whereupon the crude product could, again, be purified by means of the above noted techniques.

In utilizing my ethylenically unsaturated derivatives in the preparation of homo- and copolymers, there may be employed any of the usual vinyl polymerization methods which are well known to those skilled in the art and which is particularly suited for the homo- and copolymer whose preparation is desired. Thus, such polymers may be prepared by means of free radical initiated processes utilizing bulk, suspension, solution, or emulsion polymerization techniques; or, they may be prepared by ionic catalysis or by means of stereo-specific catalysts such as those of the type developed by Ziegler.

However, inasmuch as it is far more convenient, in the process of this invention, to utilize these copolymers in the form of their organic solvent solutions, it is accordingly preferable to prepare them by means of a free radical initiated, solution polymerization technique in an organic solvent medium consisting of one or more of such solvents as ethyl acetate, isopropanol and 2-butanone.

The comonomers which may be utilized together with the above described ethylenically unsaturated derivatives for the preparation of the crosslinkable copolymers of this invention can be any ethylenically unsaturated monomer such, for example, as styrene; alpha-methyl styrene; the acrylic and methacrylic acid esters of aliphatic alcohols such as methyl, ethyl, propyl, butyl, isobutyl, amyl, hexyl, 2-ethyl hexyl, octyl, lauryl and stearyl alcohols; acrylic acid, methacrylic acid; isoprene; acrylamide; methacrylamide, acrylonitrile; methacrylonitrile; butadiene; vinyl propionate; dibutyl fumarate; dibutyl maleate; diallyl phthalate; vinylidene chloride; vinyl chloride; vinyl fluoride; vinyl acetate; ethylene; and, propylene, etc. Any of these monomers may be used either alone or in combination with one another together with one or more of the ethylenically unsaturated derivatives.

In order to effectively crosslink upon exposure to ultraviolet and visible light, the copolymers of this invention should contain from about 0.1 to 50%, by weight, of at least one of these ethylenically unsaturated derivatives. When the concentration of ethylenically unsaturated derivative substantially exceeds about 50%, by weight, the crosslinking efficiency of the copolymer is markedly reduced because of the reduced concentration, in the copolymer, of the moieties derived from those conventional monomers which appear to enter into the crosslinking reaction.

The copolymers of this invention, whether prepared by means of bulk, suspension, solution, or emulsion polymerization techniques or by other means, are all characterized by their sensitivity to ultra-violet and visible light and thus are readily crosslinked by exposure thereto.

In addition to the preparation of conventional copolymers which are prepared by the polymerization of one or more of the novel derivatives of this invention together with one or more vinyl comonomers, it is also possible to prepare graft copolymers wherein the derivatives of this invention are polymerized in the presence of previously prepared vinyl polymers such as polyolefins, polyvinyl halides and polyvinyl esters. The resulting graft copolymers also exhibit excellent crosslinking ability upon being exposed to ultra-violet and visible light.

In order to crosslink the novel copolymers of this invention, it is merely necessary to expose them to ultraviolet or visible light, i.e. to radiation having a wavelength of 200 to 7,000 A., for a period of time which is sufficient to accomplish the desired amount of crosslinking and yet which will not result in any undersirable degradation of the copolymer, said degradation being in the form of oxidation and chain cleavage of the copolymer and being manifested by discoloration and a marked deterioration in the physical properties of the copolymer composition. The length of exposure will also be dependent on the source of radiation as well as on the distance between the source and the copolymer sample.

The crosslinking procedure may be conducted while the copolymer is still in the initial physical form resulting from the polymerization procedure. However, it is preferred and more convenient to effect the crosslinking reaaction after the polymer has been formed into a shaped article, e.g. a film, coating, or molded article. In either instance, the degree of crosslinking will be determined by the extent to which the copolymer has been insolubilized. Thus, for example, if the copolymer is still in solution, crosslinking will be evidenced by the progressive precipitation or gellation of the dissolved copolymer. On the other hand, if the copolymer has been formed into a shaped article, crosslinking will be noted by the resistance exhibited by the shaped article to solvents in which it would ordinarily dissolve or soften.

The resulting crosslinked compositions can now be used for a wide variety of applications. Thus, they may be used in applications wherein high oil, grease and solvent resistance as well as increased stiffness are required. Specifically, they may be used in photo-reproduction processes, in processes wherein it is desirable to engrave or carve intricate shapes and/or designs without the use of cutting tools, and in industrial construction, etc.

Although glycidyl acrylate and glycidyl methacrylate are the preferred ethylenically unsaturated reagents with regard to the process of this invention, other ethylenically unsaturated reagents may also be effectively utilized therein. Thus, for example, the intermediates may be reacted either with allyl glycidyl ether or butadiene monoxide, thereby preparing ethylenically unsaturated derivatives corresponding to the following formulae:

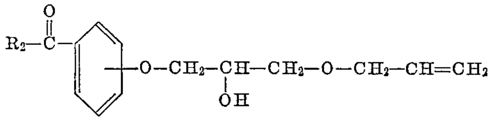

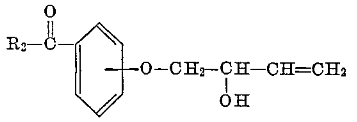

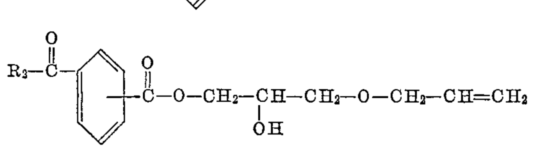

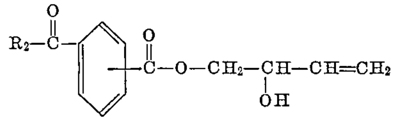

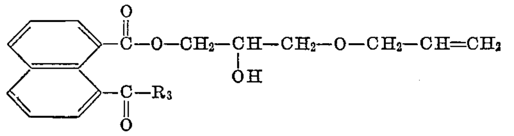

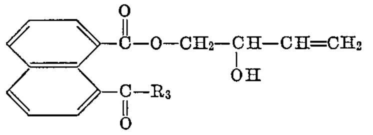

wherein $R_2$ and $R_3$ are as previously designated. Copolymeric compositions containing the derivatives also exhibit excellent crosslinking ability upon being exposed to ultraviolet and visible light.

In utilizing my novel photosensitive copolymers in the preparation of the coating systems of this invention, it is preferable, as noted earlier, that they be in the form of lacquers, i.e. organic solvent solutions, although aqueous emulsions of these copolymers may also be used if so desired. The resin solids content of these solutions or emulsions should, preferably, be in the range of from about 5 to 80%, by weight.

It is often desirable, although not essential, to introduce various additives into the solution or emulsion of these photosensitive copolymers in order to increase their sensitivity to light. Suitable additives of this type, which are referred to as photosensitizers include phenanthrenequinone; 2-methylanthaquinone; 1,4- and 1,2 - naphthoquinone; 1,4-benzoquinone; dibenzoylnaphthalene; benzophenone; 4,4′ - tetramethyldiaminobenzophenone; acetophenone; benzaldehyde; 2- or 9-acetylphenanthrene; benzoyl peroxide; and, any of the halogenated, nitrated, or sulfonated or alkylated derivatives of the reagents. The latter class of additives may be utilized in concentration of from about 0.01 to 10%, as based on the weight of copolymer resin solids.

It is also possible to admix these photosensitive polymers with up to about 50%, by weight, of their resin solids, of a previously prepared conventional, i.e. light inactive, polymer such, for example, as poly(n-butyl methacrylate), poly(iso-butyl methacrylate) or a copolymer of n-butyl and isobutyl methacrylate, etc. Thus, the addition of the polymers does not result in the loss of any light sensitivity on the part of the photosensitive polymer and they may, therefore, be utilized as low cost extenders for these more costlier materials.

Other possible additives include non-polymeric, organic or inorganic fillers or reinforcing agents, which form essentially transparent compositions, e.g. the organophilic silicas, the bentonites, silica, powdered glass, and the like. Similarly, dyes and pigments which do not appreciably absorb light at the wave length being used for exposure can be admixed with the photosensitive polymer. Suitable dyes include Fuchsine (CI 42510), Calcocide Green S (CI 44090), Solvent Yellow 34 (CI 4100B), etc. Suitable pigments include titanium dioxide, colloidal carbon, graphite, ceramics, clays, phosphor particles and metal particles, e.g. aluminum, magnetic iron, copper, etc. It should be noted that only surface photo-crosslinking will occur in those instances where pigments which are oqaque to ultra-violet light are employed.

The actual preparation of these photosensitive coating systems involves the initial step of coating one or both surfaces of a selected solid substrate with a lacquer or emulsion of the photosensitive copolymer. Any suitable coating technique may be employed while applicable substrates include paper, paperboard, fiber glass sheets, metal sheets and foils, e.g. copper, aluminum, zinc, and steel etc.; glass plates; film or plates composed of various film forming synthetic resins including the homo- and copolymers of ethylene, propylene, vinyl chloride, vinylidene chloride, vinyl acetate, styrene, isobutylene, and acrylonitrile; polyvinyl acetal; polyethylene terephthalate; polyamides; and, cellulose esters such as cellulose acetate and cellulose butyrate. The polymeric substrates may contain fillers or reinforcing agents such as the various synthetic, natural or modified fibers such, for example as cellulosic fibers, e.g. cotton, cellulose acetate, viscose rayon, and paper; glass; and, polyamide fibers. These reinforced substrates may be used in laminated form.

The coating of the photosensitive polymer should be applied to the substrate so that upon drying its thickness will be in the range of from about 0.05 to 10 mils. It should be noted that the thickness of the photosensitive layer is a direct function of the thickness desired in the relief image and this will depend on the subject being reproduced and particularly on the extent of the non-printing areas. Drying of the wet polymer coating may be achieved by air drying or by the application of any other particular drying technique whose use is favored by the practitioner. The now complete photosensitive coating system may be stored for prolonged periods prior to its ultimate utilization.

In using these systems, their photosensitive polymer coatings can be insolubilized to form printing elements or chemically milled metal surfaces by being exposed to acetinic radiation through an image bearing transparency consisting of substantially opaque and transparent areas. Suitable sources of acetinic radiation include carbon arcs, mercury-vapor arcs, fluorescent lamps with special ultraviolet light emitting phosphors, argon glow lamps, tungsten lamps and photographic flood lamps. Of these, the mercury-vapor arcs, particularly the sun lamp type and the fluorescent sun lamps are most suitable. The precise time required for the exposure of one of the novel photosensitive coating systems of this invention will be dependent upon a variety of factors which include, for example, the copolymer being utilized in the coating, thickness of the coating, the presence of a photosensitizer, the type of light source and its distance from the coating.

Subsequent to their exposure, the photosensitive coatings are "developed" by being washed with a suitable solvent such as perchloroethylene, methylene chloride, ethylene dichloride, methyl ethyl ketone, n-propanol, toluene, benzene and ethyl acetate which serves to remove that portion of the coating which was not exposed to the actinic radiation. The solvent liquid used for this operation must be selected with care since it should have good solvent action on the unexposed areas, yet have little action upon either the insolubilized copolymer or the substrate. The developing solvent should be allowed to remain in contact with the coating for a period of from about 30 seconds to 3 minutes depending upon the particular solvent being utilized. The thus developed polymer coating should next be rinsed with fresh solvent and thereupon dried.

The novel photosensitive coating systems of this invention which have been prepared, exposed and developed in the manner described hereinabove are suitable for use in a wide variety of applications with the particular coating system to be chosen for a particular application being dependent primarily upon the substrate employed in its preparation. Thus, our coating systems may be used in photography, photomechanical reproductions, lithography and intaglio printing. More specific examples of such uses are offset printing, silk screen printing, duplicating pads, manifold stencil sheeting coatings, lithographic plates, relief plates, gravure plates, photoengraving, collotype and planographic type elements, magneta screens, screen stencils, dyable images of the halftone type, in direct positive and negative systems utilizing wet development which incorporate color formers and coupling agents in vapor developed systems which incorporate diazonium salts and coupling agents. For the purposes of this disclosure, the term "printing plates" as used in the claims is meant to encompass all of the latter types of end use applications.

The printing plates made in accordance with the coating systems of this invention can be used in all types of printing but are particularly suitable for use in those procedures wherein a distinct difference of height is required between the printing and non-printing areas. Such procedures include those wherein the ink is carried by the raised portion of the plate as in intaglio printing, e.g. line and inverted halftone. Moreover, they are also useful in multicolor printing.

As noted earlier, these photosensitive coating compositions are also suitable for carrying out chemical milling type operations such, for example, as in the preparation of ornamental plaques or for producing ornamental effects; as patterns for automatic engraving machines, foundry molds, cutting and stamping dies, name stamps, relief maps for braille, as rapid cure coatings, e.g. on film base; as television phosphor photobinders, as variable area sound tracks on film; for embossing plates, paper, e.g. with a die prepared from the photosensitive coating; and, particularly in the preparation of photo-resists, e.g. printed circuit resists, and other plastic articles.

The following examples will further illustrate the embodiment of this invention. In these examples, all parts given are by weight unless otherwise noted.

EXAMPLE I

This example illustrates the preparation of 1-(2-hydroxy-3-acryloxy)propyl-2-(beta-naphthoyl)benzoate, i.e.

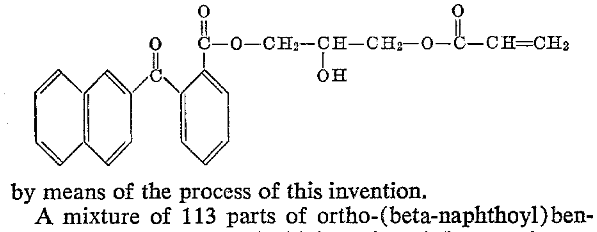

by means of the process of this invention.

A mixture of 113 parts of ortho-(beta-naphthoyl)benzoic acid, 75.5 parts of glycidyl acrylate, 2.5 parts of tetramethylammonium chloride and 0.2 part of p-methoxyphenol was heated, while under agitation, to a temperature in the range of 70° C. and maintained at that temperature for a period of 2½ hours. Upon being cooled to room temperature, the resulting reaction product, which was in the form of a viscous oil, was removed and subjected to a base titration. The latter analysis revealed that there was about 2.2% of unreacted ortho-(beta-naphthoyl)benzoic acid present within this reaction product which thereby indicated a conversion of about 96% to 1-(2 - hydroxy - 3 - acryloxy)propyl - 2 - (beta-naphthoyl)benzoate.

EXAMPLE II

This example illustrates the preparation of 1-(2-hydroxy-3-acryloxy)propyl-4,9-(anthroyl)benzoate, i.e.

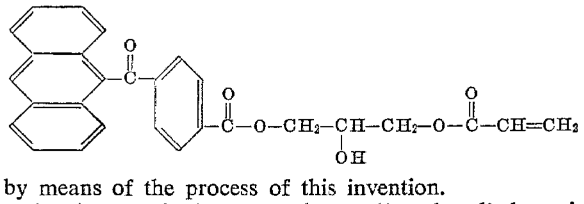

by means of the process of this invention.

A mixture of 113 parts of para-(9-anthroyl) benzoic acid, 75.5 parts of glycidyl acrylate, 4.0 parts of lithium acetate and 0.2 part of p-methoxyphenol was heated, while under agitation, to a temperature in the range of 70° C. and maintained at that temperature for a period of 2½ hours. Upon being cooled to room temperature, the resulting reaction product, which was in the form of a viscous oil, was removed and subjected to a base titrtaion. The analysis revealed that there was about 1% of unreacted para-(9-anthroyl)benzoic acid present within this reaction product which thereby indicated a conversion of about 98% to 1-(2-hydroxy-3-acryloxy)propyl-4-(9-anthroyl)benzoate.

EXAMPLE III

This example illustrates the preparation of 1-(2-hydroxy-3-methacryloxy)propoxy - 3 - (alpha-naphthoyl) benzene, i.e.

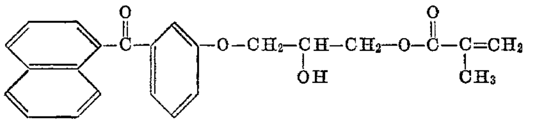

by means of the process of this invention.

A mixture of 99 parts of meta - (alpha - naphthoylphenol, 78 parts of glycidyl methacrylate, 2.5 parts of tetramethylammonium chloride and 0.2 part of p-methoxyphenol was heated, while under agitation, to a temperature in the range of 80° C. and maintained at that temperature for a period of 4 hours. Upon being cooled to room temperature, the resulting reaction product, which was in the form of a viscous oil, was removed and subjected to a base titration. The analysis revealed that there was about 1.4% of unreacted meta-(alpha-naphthoyl)phenol present within this reaction product which thereby indicated a conversion of about 97% to 1-(2-hydroxy - 3 - methacryloxy)propoxy-3-(alpha-naphthoyl) benzene.

EXAMPLE IV

This example illustrates the preparation of 1-(2-hydroxy - 3 - methacryloxy)propoxy-2-(2-phenanthroyl) benzene, i.e.

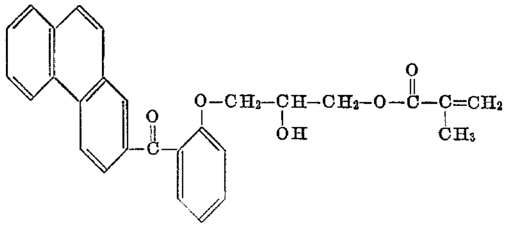

by means of the process of this invention.

A mixture of 127 parts of ortho-(2-phenanthroyl) phenol, 78 parts of glycidyl methacrylate, 2.5 parts of tetramethylammonium chloride and 0.2 part of p-methoxyphenol was heated, while under agitation, to a temperature in the range of 70° C. and mainttained at that temperature for a period of 2½ hours. Upon being cooled to room temperature, the resulting reaction product, which was in the form of a viscous oil, was removed and subjected to a base titration. The analysis revealed that there was about 2.2% of unreacted ortho-(2-phenanthroyl) phenol present within this reaction product which thereby indicated a conversion of about 96% to 1-(2-hydroxy-3-methacryloxy)propoxy - 2 - (2 - phenanthroyl) benzene.

EXAMPLE V

This example illustrates the preparation of 1-(2-hydroxy-3-methacryloxy)propyl-8-benzoylnaphthoate, i.e.

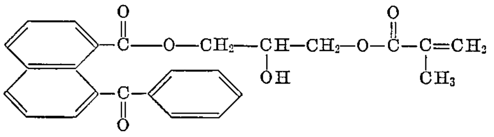

by means of the process of this invention.

A mixture of 113 parts of 8-benzoyl-1-naphthoic acid, 78 parts of glycidyl methacrylate, 2.5 parts of tetramethylammonium chloride and 0.2 part of p-methoxyphenol was heated, while under agitation, to a temperature in the range of 80° C. and maintained at that temperature for a period of 4 hours. Upon being cooled to room temperature, the resulting reaction product, which was in the form of a viscous oil, was removed and subjected to a base titration. The analysis revealed that there was about 1.4% of unreacted 8-benzoyl-1-naphthoic acid present within this reaction product which thereby indicated a conversion of about 97% to 1-(2-hydroxy-3-methacryloxy) propyl-8-benzoylnaphthoate.

EXAMPLE VI

This example illustrates the preparation of 1-(2-hydroxy - 3 - methacryloxy)propyl - 8 - (alpha - naphthoyl) naphthoate, i.e.

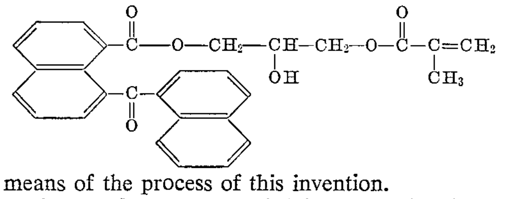

by means of the process of this invention.

A mixture of 113 parts of 8-(alpha-naphthoyl)-1-naphthoic acid, 78 parts of glycidyl methacrylate, 2.5 parts of tetramethylammonium chloride and 0.2 part of p-methoxyphenol was heated, while under agitation, to a temperature in the range of 80° C. and maintained at that temperature for a period of four hours. Upon being cooled to room temperature, the resulting reaction product, which was in the form of a viscous oil, was removed and subjected to a base titration. The analysis revealed that there was about 1.4% of unreacted 8-(alpha-naphthoyl)-1-naphthoic acid present within this reaction product which thereby indicated a conversion of about 97% to 1-(2-hydroxy - 3 - methacryloxy)propyl - 8 - (alpha-naphthoyl)naphthoate.

EXAMPLE VII

This example illustrates the preparation of the novel copolymers of this invention by means of a solution polymerization technique and also demonstrates the ability of the resulting copolymers to crosslink upon being exposed to a light source.

In each instance, the copolymer was prepared by charging the above identified ingredients into a reactor equipped with a reflux condenser as well as with means for mechanical agitation, the reactor being completely shielded so as to exclude all light from the reaction mixture. The resulting mixture was then refluxed, while under agitation, for a period of 6 hours whereupon it was allowed to cool and discharged from the reactor.

The ingredients listed in the following table were utilized to prepare the copolymers described in this example.

TABLE I

| | Copolymer Number | | | | | | | | | |
|---|---|---|---|---|---|---|---|---|---|---|
| | 1 | 2 | 3 | 4 | 5 | 6 | 7 | 8 | 9 | 10 |
| | Parts | | | | | | | | | |
| 1-(2-hydroxy-3-acryloxy)propyl-2-(beta-naphthoyl)benzoate | 30 | 15 | 9 | 1 | | | | | | |
| 1-(2-hydroxy-3-acryloxy)propyl-4-(9-anthroyl)-benzoate | | | | | 30 | | | | | |
| 1-(2-hydroxy-3-methacryloxy)propoxy-3-(alpha-naphthoyl)benzene | | | | | | 10 | | | | |
| 1-(2-hydroxy-3-methacryloxy)propoxy-2-(2-phenanthroyl)benzene | | | | | | | 5 | 5 | | |
| 1-(2-hydroxy-3-methacryloxy)propyl-8-benzoyl naphthoate | | | | | | | | | 5 | |
| 1-(2-hydroxy-3-methacryloxy)propyl-8-(alpha-naphthoyl)naphthoate | | | | | | | | | | 5 |
| Ethyl acrylate | 30 | 45 | 51 | 59 | | 50 | | 95 | | |
| Methyl acrylate | | | | | 30 | | 45 | | | |
| Butyl acrylate | | | | | | | | | 95 | |
| Butyl methacrylate | | | | | | | | | | 95 |
| Ethyl acetate | 60 | 120 | 120 | 120 | 60 | 120 | 100 | 150 | 150 | 150 |
| Isopropanol | 60 | | | | 60 | | | | | |
| Benzoyl peroxide | 0.6 | 0.6 | 0.6 | 0.6 | 0.6 | 0.6 | 0.4 | 0.75 | 0.65 | 0.75 |
| Final resin solids content (percent, by weight) | 32.8 | 32.9 | 33.0 | 33.0 | 32.1 | 32.8 | 32.9 | 39.9 | 39.7 | 39.6 |

In order to ascertain the crosslinking ability of the resulting copolymeric compositions, films having 3.0 mil wet thicknesses were cast from the various lacquers onto glass plates and then air-dried in total darkness. A portion of each of the films was then masked off and the entire film thereupon exposed, for a period of 15 minutes, to a fluorescent black-light source which was positioned at a distance of 8" from the film samples.

Thereafter, the masking was removed and the entire film surface washed with acetone. In each instance, the unexposed portion of the film was readily soluble in the acetone whereas the exposed portion exhibited a substantially reduced solubility. The reduction in solubility is thus clearly indicative of the ability of films prepared from copolymers containing the novel derivatives of this invention to crosslink upon being exposed to a suitable light source.

EXAMPLE VIII

This example illustrates the preparation and use, in a printing operation, of one of the novel photosensitive coating of this invention.

Following the polymerization procedure outlined in Example VII, hereinabove, a 40:60 1-(2-hydroxy-3-acryloxy)propyl-2-(beta-naphthoyl)benzoate:isobutyl methacrylate solution copolymer in a solvent system comprising a 75:25 benzene:methylene chloride mixture was prepared. The resin solids content of the lacquer was reduced to a level of 10%, by weight, by the addition of a sufficient quantity of 2-butanone and a concentration of phenanthrenequinone equal to 2% of the weight of the copolymer resin solids was then added.

A bimetallic lithographic plate consisting of an electrodeposited film of copper over an aluminum substrate was then washed with acetone whereupon the lacquer was dip coated onto the copper surface of the plate so as to yield a film which upon drying had a thickness of 0.2 mil. This photosensitive coating was exposed, through a half tone negative mounted on a conventional vacuum frame, to the light from a General Electric RS sunlamp positioned at a distance of 12 inches from the frame. The minimum exposure time necessary to obtain the desired degree of crosslinking was 45 seconds.

After exposure, the plate was developed by covering it with perchloroethylene which acted as a solvent for the uncrosslinked copolymer. The solvent was gently spread over the copolymer coating with a cotton swab. The development step was allowed to proceed for a period of about ½ to 1 minute. After rinsing with fresh perchloroethylene and drying, the copper surface that had been exposed by the removal of the uncrosslinked polymer, i.e. the areas corresponding to the opaque areas of the negative were etched away using an aqueous solution of ferric nitrate having a density of about 1.5. The areas protected by the insolubilized polymer coating were completely unaffected by the etch solution whereas those which were devoid of the protective crosslinked copolymer coating were dissolved away so as to expose the aluminum substrate.

After being washed with water and dried, the resulting image on the plate was found to be of the opposite photographic sign to that of the original negative. This plate was then run upon a lithographic type press in the conventional manner and yielded excellent reproductions. Thus, the quality of the image was such that dots smaller than 40 microns in size could be easily obtained. Subsequent to the press run, the residual crosslinked polymer coating can, if desired, be removed by gentle rubbing with a powerful solvent such as ethylene glycol monoethyl ether acetate.

In a repetition of the above described procedure, the exposure time was, in this instance, increased to 10 minutes and the negative utilized was a conventional $\sqrt{2}$ step wedge which is available in the form of the Graphic Arts Technical Foundation, i.e. the G.A.T.F., sensitivity guide. After development, insolubilization to Step 13 on the latter guide was observed.

EXAMPLE IX

This example illustrates the preparation and subsequent use of one of the novel photosensitive coating systems of this invention in a chemical milling procedure.

Following the polymerization procedure outlined in Example VII, hereinabove, a 30:70 1-(2-hydroxy-3-methacryloxy)propyl-2-(beta-naphthoyl) benzoate:n-butyl methacrylate solution copolymer in a solvent system comprising a 75:25 benzene:methylene chloride mixture was prepared. The resin solids content of the lacquer was then reduced to a level of 10%, by weight, by the addition of a sufficient quantity of 2-butanone.

A film of the above described copolymer lacquer having a dry thickness of 0.25 mil was coated upon both surfaces of a cleaned and grained aluminum plate having a thickness of 0.01 inch. This plate was exposed on both surfaces through a dot negative wherein the dots were present as opaque areas on a transparent background. The light source utilized for the exposure was a 275 watt sunlamp which was placed at a distance of 12 inches from the sample. After a 3 minute exposure of each surface of the plate, the uncrosslinked copolymer was removed by gently spraying methylene chloride over each surface thus leaving behind only the crosslinked portions of the copolymer coating in the form of a resist stencil. After drying, the now exposed areas of the aluminum plate were dissolved away using a conventional lithographic etching solution for aluminum. At the completion of this etching procedure, the areas of the plate corresponding to the opaque dots upon the negative were now observed to be in the form of very fine holes on the plate's surface.

EXAMPLE X

This example illustrates the preparation and use of a number of the photosensitive coating systems of this invention which were based, respectively, upon a variety of different photosensitive copolymers.

In this example, the copolymer lacquers described in Table I of Example VII, hereinabove, were diluted and coated upon a number of the bimetallic lithographic plates of the type described in Example VIII. In Table II, there are set forth the pertinent data relating to the respective film thicknesses, light sources and their exposure times, distance from the coating, developer solutions, and development times which were utilized in the preparation and development of the coating systems prepared with each of the copolymers described in Table I.

TABLE II

| | Copolymer lacquer Number | | | | | | | | | |
|---|---|---|---|---|---|---|---|---|---|---|
| | 1 | 2 | 3 | 4 | 5 | 6 | 7 | 8 | 9 | 10 |
| Coating thickness (mils) | 0.2 | 0.2 | 0.2 | 0.2 | 0.2 | 0.2 | 0.2 | 0.2 | 0.2 | 0.2 |
| Light source [1] | B | B | A | A | A | A | A | A | A | A |
| Distance from coating (inches) | 6 | 6 | 12 | 12 | 12 | 12 | 12 | 12 | 12 | 12 |
| Time of exposure (minutes) | 10 | 10 | 5 | 5 | 5 | 5 | 5 | 5 | 5 | 5 |
| Developer solvent [2] | A | A | B | B | B | B | C | C | C | C |
| Step insolubilized to on the G.A.T.F. guide | 5 | 6 | 8 | 2 | 5 | 7 | 6 | 2 | 3 | 1 |

[1] Light source, A=275 watt General Electric sunlamp; B=30 watt black light fluorescent lamp.

[2] Solvent, A=Perchloroethylene; B=Methylene chloride; C=2-butanone.

In a repetition of the above procedure, copolymer lacquer #1 was modified by the substitution, in turn, of 30 parts of each of the below listed comonomers for the 30 parts of ethyl acrylate initially contained therein. The thus substituted comonomers were: styrene, vinyl chloride, acrylic acid and dibutyl maleate.

Summarizing, this invention is thus seen to provide a novel class of ethylenically unsaturated derivatives which may be incorporated into a wide variety of copolymers; the resulting copolymers thereby being characterized by their ability to crosslink upon being exposed to an appropriate light source. This invention further provides the practitioner with a novel class of photosensitive coating systems based upon the latter copolymers.

Variations may be made in procedures, proportions and materials without departing from the scope of this invention which is defined by the following claims.

What is claimed is:

1. An ethylenically unsaturated derivative selected from the group consisting of

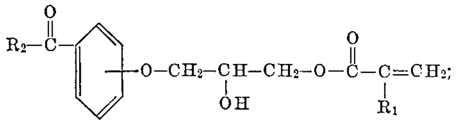

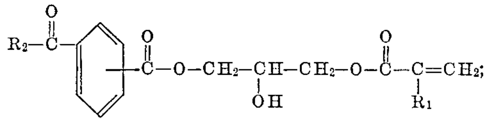

and

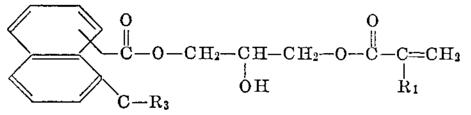

wherein $R_1$ is selected from the group consisting of hydrogen atoms and methyl radicals;

$R_2$ is a radical selected from the group consisting of naphthyl, anthracenyl, and phenanthracenyl radicals; and, $R_3$ is a radical selected from the group consisting of phenyl, naphthyl, anthracenyl and phenanthracenyl radicals.

2. A composition comprising a polymer of at least one ethylenically unsaturated monomer together with at least one ethylenically unsaturated derivative selected from the group consisting of

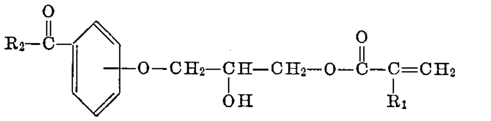

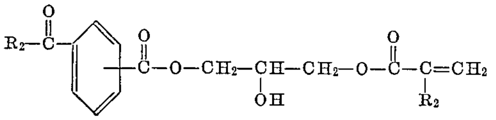

and

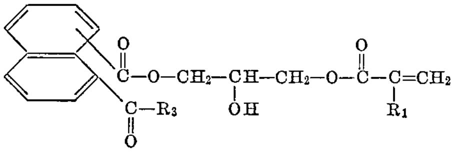

wherein $R_1$ is selected from the group consisting of hydrogen atoms and methyl radicals;

$R_2$ is a radical selected from the group consisting of naphthyl, anthracenyl, and phenanthracenyl radicals; and, $R_3$ is a radical selected from the group consisting of phenyl, naphthyl, anthracenyl and phenanthracenyl radicals.

3. The composition of claim 2, wherein said ethylenically unsaturated monomer is selected from the group consisting of styrene, alpha-methyl styrene, the acrylic and methacrylic esters of aliphatic alcohols, acrylic acid, methacrylic acid, isoprene, acrylamide, methacrylamide, acrylonitrile, methacrylonitrile, butadiene, vinyl propionate, dibutyl fumarate, dibutyl maleate, diallyl phthalate, vinylidene chloride, vinyl chloride, vinyl acetate, ethylene and propylene.

4. A process for preparing crosslinked polymers, said process comprising the steps of heating at least one ethylenically unsaturated monomer, in the presence of a free radical initiator, together with at least one ethylenically unsaturated derivative selected from the group consisting of

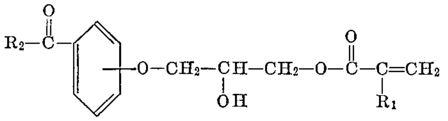

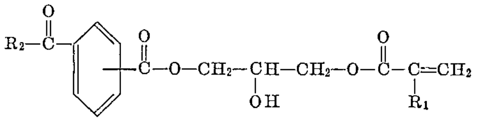

and

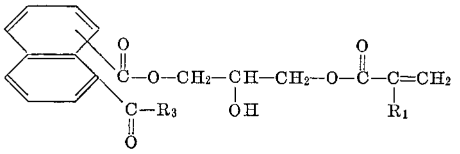

wherein $R_1$ is selected from the group consisting of hydrogen atoms and methyl radicals;

$R_2$ is a radical selected from the group consisting of naphthyl, anthracenyl, and phenanthracenyl radicals; and, $R_3$ is a radical selected from the group consisting of phenyl, naphthyl, anthracenyl and phenanthracenyl radicals;

and thereafter exposing the resulting polymer to radiation having a wavelength of from about 200 to 7000 A.

5. The process of claim 4, wherein said ethylenically unsaturated monomer is selected from the group consisting of styrene, alpha-methyl styrene, the acrylic and methacrylic esters of aliphatic alcohols, acrylic acid, methacrylic acid, isoprene, acrylamide, methacrylamide, acrylonitrile, methacrylonitrile, butadiene, vinyl propionate, dibutyl fumarate, dibutyl maleate, diallyl phthalate, vinylidene chloride, vinyl chloride, vinyl acetate, ethylene and propylene.

6. The process of claim 4, wherein said polymer is formed into a shaped article prior to being exposed to said radiation.

7. The crosslinked composition prepared by the process of claim 4.

References Cited

UNITED STATES PATENTS

| | | | |
|---|---|---|---|
| 3,173,893 | 3/1965 | Fertig | 260—62 |
| 3,214,492 | 10/1965 | Tocker | 260—878 |
| 3,341,493 | 9/1967 | Goldberg | 260—47 |
| 3,429,852 | 2/1969 | Skoultchi | 260—47 |

JOSEPH L. SCHOFER, Primary Examiner

C. A. HENDERSON, Jr., Assistant Examiner

U.S. Cl. X.R.

96—35.1; 204—159.14; 260— 62, 469, 476, 486, 875, 884